United States Patent [19]
Raymond

[11] Patent Number: 5,760,893
[45] Date of Patent: Jun. 2, 1998

[54] METHOD AND APPARATUS FOR INSPECTING COMPONENT PLACEMENT AND SOLDER CONNECTION IN PRINTED CIRCUIT BOARD MANUFACTURE

[75] Inventor: Douglas W. Raymond, Orinda, Calif.

[73] Assignee: Teradyne, Inc., Boston, Mass.

[21] Appl. No.: 773,666

[22] Filed: Dec. 24, 1996

[51] Int. Cl.[6] ........................ G01B 11/00
[52] U.S. Cl. .............. 356/237; 356/394; 356/376
[58] Field of Search ............... 356/394, 375, 356/376, 237; 348/87, 126, 129

[56] References Cited

U.S. PATENT DOCUMENTS

| | | | |
|---|---|---|---|
| 4,978,220 | 12/1990 | Abramovich et al. | 356/394 |
| 5,060,065 | 10/1991 | Wasserman | 358/106 |
| 5,064,291 | 11/1991 | Reiser | 356/394 |
| 5,103,105 | 4/1992 | Ikegaya et al. | 356/394 |
| 5,166,753 | 11/1992 | Tokura | 356/394 |
| 5,200,799 | 4/1993 | Maruyama et al. | 356/394 |
| 5,245,421 | 9/1993 | Robertson et al. | 358/101 |
| 5,260,779 | 11/1993 | Wasserman | 358/93 |
| 5,517,235 | 5/1996 | Wasserman | 348/126 |
| 5,568,264 | 10/1996 | Nakatsuka et al. | 356/394 |

*Primary Examiner*—Hoa Q. Pham
*Attorney, Agent, or Firm*—Richard E. Gamache

[57] ABSTRACT

A manufacturing defect analyzer, for inspecting assembled printed circuit boards, including a light source, an optical receiver, a computer controller, and a memory. A plurality of key-points are specified for each component mounted to a printed circuit board. A data record characterizing each key-point is then stored in memory. Next, the defect analyzer measures the height of selected key-points relative to reference key-points for each component. Finally, the measured heights are compared with limit values, thereby determining whether each component is defectively attached to the printed circuit board. The data records facilitate inspection of printed circuit boards having components that are available in different package types.

15 Claims, 5 Drawing Sheets

METHOD AND APPARATUS FOR INSPECTING COMPONENT PLACEMENT AND SOLDER CONNECTION IN PRINTED CIRCUIT BOARD MANUFACTURE

BACKGROUND OF THE INVENTION

This invention relates generally to the manufacture of printed circuit boards, and more specifically, to manufacturing defect analyzers.

Printed circuit boards are typically tested during the manufacturing process to determine whether the boards contain manufacturing defects. In this way, defective printed circuit boards are identified before being incorporated into electronic products, thereby minimizing the chance that the electronic products will fail prematurely in the field.

One method of testing printed circuit boards is known as card edge testing, which includes attaching a test device to input and output ports of a board under test (BUT), applying test signals to selected input ports, detecting response signals at selected output ports, and comparing the response signals to expected results. The applied test signals typically instruct the BUT to perform a series of predetermined functions. The detected response signals are then analyzed to determine whether the BUT performed the predetermined functions correctly.

However, card edge testing has certain limitations. In general, card edge testing is most useful for testing printed circuit boards that have a relatively small number of components, which are capable of performing only a limited number of functions. However, as the number of components mounted to printed circuit boards has increased, the number of functions that the boards perform has also increased. As a result, card edge testing no longer provides the fault coverage that many printed circuit board manufacturers require.

An improvement to card edge testing is in-circuit testing, which includes attaching a fixture, called a "bed-of-nails," to certain nodes on the BUT, applying test signals to selected nodes, and evaluating response signals detected at other selected nodes. The bed-of-nails fixture typically isolates a small number of components from the remaining components on the BUT. Functional testing is then performed on the isolated components. In-circuit testing is typically repeated until all of the components on the BUT have been tested. Board manufacturers have used in-circuit testing to test relatively large printed circuit boards with many components.

Nevertheless, in-circuit testing also has certain limitations. For example, both active and passive components must be spaced far enough apart on the BUT so that nodes are accessible to the bed-of-nails fixture. However, this spacing requirement cannot always be satisfied on densely populated printed circuit boards. It is particularly difficult to access the nodes on printed circuit boards that are designed using PCMCIA technology, which is typically used in the manufacture of boards for laptop computers.

Also, in-circuit testing generally does not provide complete fault coverage. For example, in-circuit testing cannot reliably detect missing by-pass capacitors, joints with insufficient amounts of solder, bent leads on semiconductor packages, or improperly aligned components.

Another method of verifying printed circuit boards is generally known as optical inspection. Originally, optical inspection was performed by human inspectors using either the naked eye or a microscope. At certain stages of the printed circuit board manufacturing process, human inspectors typically looked for missing components, extra components, improperly oriented components, tilted semiconductor packages, crooked leads, faulty solder joints, or solder bridges between closely-spaced leads. Further, by combining visual inspection with in-circuit testing, many board manufacturers have achieved nearly 100% fault coverage. However, as printed circuit boards became more complex, visual inspection of boards proved to be slow, inaccurate and expensive.

An improvement to visual inspection is automatic optical inspection (AOI), which generally uses an illumination device and a series of video cameras mounted in a fixture. A test computer typically controls movement of the fixture relative to the BUT, thereby allowing the cameras to scan and obtain images of a surface of the BUT. The test computer then digitizes the images for subsequent analysis. Because AOI devices are used to perform non-contact testing, they are generally unaffected by inaccessible nodes on densely populated printed circuit boards. Also, over the long term, AOI devices tend to be more accurate than human inspectors.

Nevertheless, AOI devices also have some disadvantages. For example, in a typical AOI device, video cameras capture light and color characteristics of the surfaces of the BUT, the components, and the solder joints within their respective fields of view. The AOI device then converts the captured light and color information into digitized image data, which is analyzed by the test computer. However, the surfaces of the BUT, the components, and the solder joints each have a relatively wide range of acceptable parameters relating to reflectivity, color, and texture. This means that in order to obtain accurate results, AOI devices must be programmed and operated by highly trained technical personnel. Even if highly trained personnel are used, AOI sometimes results in either the rejection of good boards or the acceptance of faulty boards.

Another limitation of AOI devices is that the characteristics of both the illuminators and the video cameras can vary from AOI device to AOI device. As a result, a test program written for one AOI device might not function properly on another AOI device. Finally, AOI devices are generally slow, thereby making them less adaptable to some high speed manufacturing processes.

Accordingly, it would be desirable to have a reliable way of detecting missing components, extra components, improperly oriented components, tilted semiconductor packages, bent leads, faulty solder joints, and solder bridges between closely-spaced leads on densely populated printed circuit boards. It would also be desirable to have a manufacturing defect analyzer that locates faults quickly, is easy to program and operate, and can run test programs developed for other defect analyzers without modification.

SUMMARY OF THE INVENTION

With the foregoing background in mind, it is an object of the invention to provide a reliable way of detecting both missing components and improperly placed components in the manufacture of printed circuit boards.

Another object of the invention is to provide a reliable way of detecting faulty connections between the components and the printed circuit board.

Still another object of the invention is to provide a manufacturing defect analyzer that supports portable test programs.

The foregoing and other objects are achieved by specifying a plurality of key-points for selected components mounted to a printed circuit board. During a test, the height of each key-point associated with a selected component is measured relative to a local reference. Each measured height is then compared with a range of acceptable parameters. Finally, comparison results are analyzed to determine whether the selected component is missing or improperly placed, or whether there are any faulty connections between the selected component and the printed circuit board.

In one embodiment, a measured height of each key-point associated with a selected component is sequentially compared with a plurality of sets of acceptable parameters, wherein each set corresponds to a particular component package type. If the measured height of each key-point is not within the range of acceptable parameters in any set, then a fault is indicated. Alternatively, if the measured height for each key-point matches the acceptable parameters in one of the plurality of sets, then the measured height of each key-point associated with a corresponding component on a subsequent printed circuit board is compared first with the parameters in the matching set. If the measured height of each key-point associated with the corresponding component is not within the range of acceptable parameters in the matching set, then the measured heights are compared next with a previously matching set, if any. Finally, if the measured height of each key-point is not within the range of acceptable parameters in the previously matching set, then the measured heights are sequentially compared with remaining sets of acceptable parameters.

Still further objects and advantages will become apparent from a consideration of the ensuing description and drawings.

BRIEF DESCRIPTION OF THE DRAWINGS

The invention will be better understood by reference to the following more detailed description and accompanying drawings in which.

DESCRIPTION OF THE PREFERRED EMBODIMENT

Figure 1:
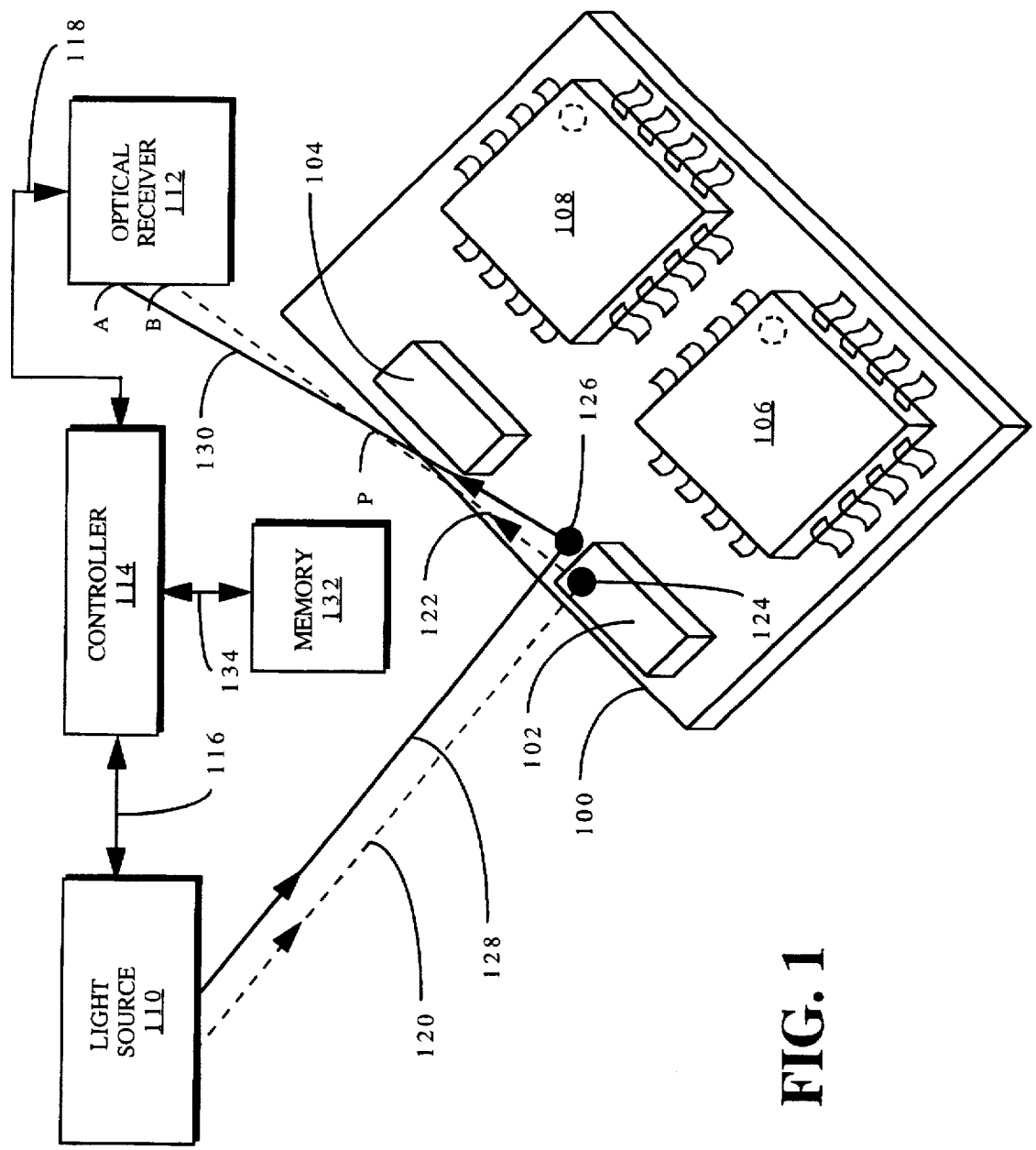
FIG. 1 is a simplified illustration of a printed circuit board being tested according to the invention.

FIG. 1 shows BUT 100, which is manufactured according to any known process. Because FIG. 1 is meant to be a simplified illustration of a printed circuit board, BUT 100 is depicted as being small in size, and having only four components mounted to it. However, it is important to note that a manufacturing defect analyzer according to the present invention may be used to test printed circuit boards of any size, with any number of components. Further, the defect analyzer is particularly useful in testing large, densely populated printed circuit boards.

As mentioned above, four electronic components are shown mounted to BUT 100. In particular, FIG. 1 shows chip resistors 102 and 104, and semiconductor packages 106 and 108. Although components 102, 104, 106, and 108 are depicted as surface mount components, it should be appreciated that the defect analyzer may also be used to test printed circuit boards with through-hole components.

The defect analyzer includes light source 110, optical receiver 112, computer controller 114, and memory 132. In the embodiment shown, light source 110 emits light beam 128 toward key-point 126 on a surface of BUT 100. In an alternative embodiment, light source 110 may simultaneously emit a plurality of light beams toward a plurality of key-points. Further, persons skilled in the art may use collimating lenses (not shown) for forming light beam 128.

In general, a key-point is a location on a surface of a component, a solder connection, or the BUT. In the preferred embodiment, a plurality of key-points are specified for each component on the BUT. Further, each key-point serves as a target for light source 110.

Light beam 128 is typically produced by either an infrared LED or a laser diode. In the preferred embodiment, light beam 128 is produced by a laser diode, such as the laser diode found in the Laser Distance Sensor manufactured by Dynamic Control Systems, Inc., British Columbia, Canada.

Light beam 128 strikes the surface of BUT 100 at key-point 126, thereby producing a diffuse reflection of light (not shown). Persons skilled in the art may use focusing lenses (not shown) for forming incident beam 130 from the diffuse reflection. Incident beam 130 strikes optical receiver 112 at point A. Finally, computer controller 114 stores data characterizing each key-point in memory 132, controls the generation of light beam 128 (and light beam 120), analyzes the output of optical receiver 112, and stores analysis results in memory 132.

In the preferred embodiment, optical receiver 112 includes a position-sensitive detector (PSD, not shown), such as the PSD included in the Laser Distance Sensor mentioned above. A typical PSD includes a silicon photodiode, which generates a current output when a light beam strikes it. In particular, an output of the PSD is a function of a position of an incident beam of light. Even though color and finish characteristics of a reflecting surface might affect the amount of light striking the PSD, focusing lenses can be used to ensure that the incident beam strikes the PSD as a small spot of light. Because the output of the PSD is dependent upon the position of the small spot of light, as opposed to its intensity, the output of the PSD is generally unaffected by the surface characteristics of BUT 100, and components 102, 104, 106, and 108.

More specifically, the PSD found in the Laser Distance Sensor is a PIN diode with two current outputs, whose relative values are determined by a position of an incident spot of light. For example, if the incident spot of light strikes the PIN diode in a center location, then the magnitude of the two current outputs will be equal. Alternatively, if the incident light does not strike the PIN diode in the center location, then the magnitude of one output will increase while the magnitude of another output will proportionally decrease, depending upon which side of the center location receives the incident light.

An important advantage of the present invention is that it can reliably detect numerous types of faults on an assembled printed circuit board by simply measuring heights of specified key-points relative to local references. For the simplified illustration shown in FIG. 1, key-point 126 might serve as the local reference when measuring the height of key-point 124.

Figure 2:
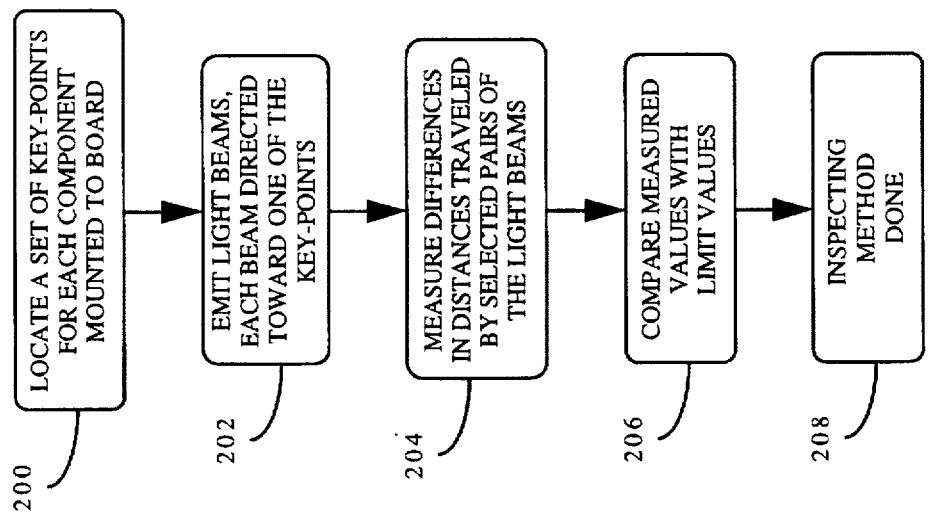
FIG. 2 is a flowchart depicting an inspecting method according to the present invention.

In the preferred embodiment, the inspecting method of the present invention is implemented in accordance with the procedure shown in FIG. 2. First, a set of key-points is located in block 200 for each component mounted to a BUT. For the simplified illustration shown in FIG. 1, key-point 124 and local reference key-point 126 might be located for component 102.

Next, a plurality of light beams is emitted in block 202, whereby each light beam strikes one of the key-points located in block 200. For the simplified illustration of FIG. 1, light source 110 emits light beam 128, which strikes the surface of BUT 100 and produces a diffuse reflection (not shown) at key-point 126. Light source 110 then emits light beam 120, which strikes the surface of component 102 and produces a diffuse reflection (not shown) at key-point 124. Focusing lenses (not shown), typically located at point P, transform the diffuse reflections into incident beams 130 and 122.

Next, differences in distances traveled by selected pairs of lights beams are measured in block 204. For the simplified illustration of FIG. 1, the difference in the distances traveled by light beams 128 and 120, which corresponds to the height of key-point 124 relative to local reference 126, is measured by computer controller 114 using known triangulation techniques.

In particular, incident beams 130 and 122 strike optical receiver 112 at points A and B, respectively, thereby causing the PSD included in optical receiver 112 to produce two pairs of current outputs. Because incident beams 130 and 122 intersect at point P, two similar triangles are formed, wherein the distance between the points A and B is proportional to the vertical distance between key-points 126 and 124. As a result, computer controller 114 uses the two pairs of current outputs for measuring the distance between points A and B, which is proportional to the height of key-point 124 relative to local reference 126.

Finally, the distances measured in block 204 are compared with height limit values in block 206, thereby determining whether each component is defectively attached to the BUT.

Figure 3:
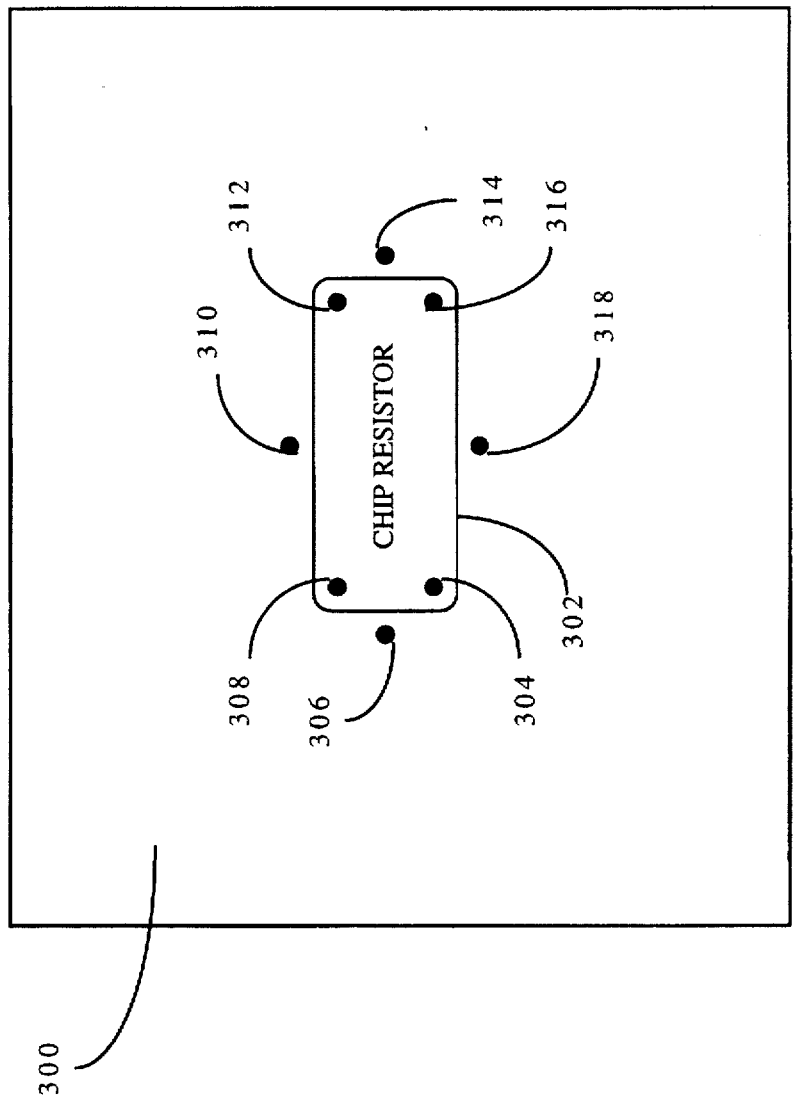
FIG. 3 is a simplified illustration of locations of key-points on a component mounted to a printed circuit board.

Turning to FIG. 3, key-points 304, 306, 308, 310, 312, 314, 316, and 318, associated with chip resistor 302, are shown. Further, chip resistor 302 is shown mounted to BUT 300.

Although key-points 304, 306, 308, 310, 312, 314, 316, and 318 may be used to detect faults related to chip resistor 302, other key-points might also be specified. Nevertheless, in the preferred embodiment, a set of key-points for a component will generally include a point on a surface of the BUT adjacent to the component, a point on a surface of a solder joint (not shown), a point on a surface of the BUT near an edge of the component and between adjacent leads (not shown), a point on a top surface of the component near an edge, and a point on an orientation mark (not shown).

The defect analyzer may be used to detect faults related to chip resistor 302 as follows. It should be appreciated that other tests for detecting faults may also be formulated. First, any one of key-points 306, 310, 314, or 318 is chosen as a local reference for measuring the height of key-points 304, 308, 312, and 316. The measured heights of key-points 304, 308, 312, and 316 are then determined according to the typical test sequence described above. If each measured height is equal to zero, then the defect analyzer indicates that chip resistor 302 is missing. Alternatively, if at least one measured height is not equal to zero, then chip resistor 302 is assumed to be present on BUT 300 and additional tests are performed.

For example, if the measured heights of key-points 304 and 312 are each within an acceptable range, but the measured heights of key-points 308 and 316 are equal to zero, then the defect analyzer indicates that chip resistor 302 is skewed. The defect analyzer would make the same indication if the measured heights of key-points 304 and 312 were equal to zero, and the measured heights of key-points 308 and 316 were within the acceptable range.

As another example, if the measured heights of an adjacent pair of key-points on chip resistor 302 were both slightly below an acceptable range, and the measured heights of the remaining pair of key-points were both slightly above the acceptable range, then the defect analyzer indicates that chip resistor 302 is tilted. The defect analyzer would make the same indication if the adjacent key-points were both slightly above, and the remaining pair of key-points were both slightly below, the acceptable range.

As still another example, if the measured heights of the adjacent pair of key-points on chip resistor 302 were both significantly below an acceptable range, and the measured heights of the remaining pair of key-points were both significantly above the acceptable range, then the defect analyzer indicates that chip resistor 302 is "tombstoned." The defect analyzer would make the same indication for the opposite situation.

Figure 4:
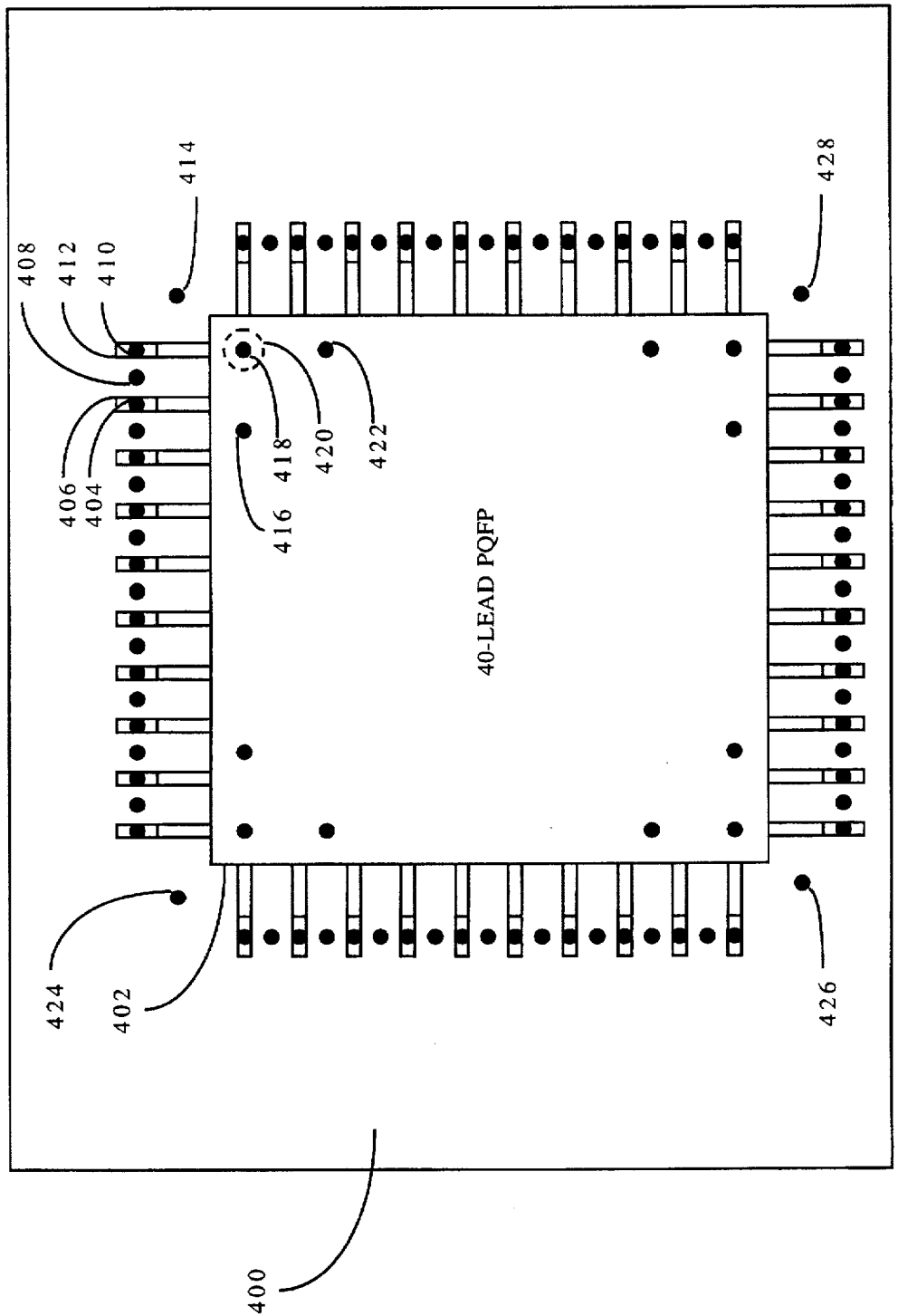
FIG. 4 is another simplified illustration of locations of key-points on a semiconductor package mounted to a printed circuit board.

Turning now to FIG. 4, key-points associated with semiconductor package 402, which is mounted to BUT 400, are shown. Although the key-points are meant to be related to a 40-lead PQFP semiconductor package, other key-points may be similarly specified for other types of semiconductor packages. Further, tests similar to those described for chip resistor 302 may be formulated for determining whether semiconductor package 402 is missing, skewed, tilted, or tombstoned.

Additionally, tests may be formulated for determining whether semiconductor package 402 is properly oriented on BUT 400. In the preferred embodiment, the heights of key-point 418 and key-points in the remaining corners of semiconductor package 402 are measured relative to another key-point on a top surface of semiconductor package 402. In particular, the height of key-point 418 might be measured relative to either key-point 416 or 422. It is important to note that if the measured height of key-point 418 were instead relative to a key-point on the surface of BUT 400 (e.g., key-point 414), tolerances would typically accumulate, thereby making the measured height of key-point 418 inaccurate.

An acceptable range of measured heights for key-point 418 differs from corresponding acceptable ranges for the key-points in the remaining corners because key-point 418 is located on orientation mark 420, which is typically either a dimple or a bump. If key-point 418 is not detected in an expected location, then the defect analyzer indicates that semiconductor package 402 is improperly oriented.

Further, if a measured height of a key-point between adjacent leads, such as key-point 408 between leads 406 and 412, is not equal to zero, then the defect analyzer indicates that a solder bridge exists between the adjacent leads. Also, if a measured height of a key-point situated on a solder joint, such as either key-point 404 or key-point 410, is not within an acceptable range, then the defect analyzer might indicate that the solder joint has an insufficient amount of solder.

It should be appreciated that the tests described above for both chip resistor 302 and semiconductor package 402 are merely examples, and many other tests for detecting and analyzing defects in printed circuit boards may be designed. For example, tests might be designed for discrete components for verifying presence, alignment, and solder. Other tests might be designed for flat-pack integrated circuits for inspecting alignment, orientation, solder, and shorts between closely-spaced leads. Still other tests might be designed for ball grid arrays, electrical connectors, and J-leaded integrated circuits for inspecting alignment and orientation.

Nevertheless, each test designed according to the present invention would include making precise physical measurements of a component relative to a local reference, and then comparing the measured values to numerical pass/fail limits. As a result, the defect analyzer eliminates the need for interpreting arrays of indefinite light and color values, thereby minimizing the number of false rejects. Of equal importance, test programs designed in accordance with the invention can produce accurate test results on any defect analyzer that has a light source, an optical receiver, a controller, and a memory, as shown in FIG. 1. This is because the test results are not dependent upon peculiar characteristics of illuminators and video cameras.

Although FIG. 3 and FIG. 4 show key-points that may be used to test individual components, such as chip resistor 302 and semiconductor package 402, the typical densely populated BUT has many components mounted to it. Further, printed circuit board manufacturing processes commonly include some form in-circuit testing. For these reasons, the present invention has features that both simplify test program generation, and make the defect analyzer more compatible with in-circuit testing.

One such feature is the creation and maintenance of data records. Each data record, which typically resides in memory 132, is a means for aggregating a group of information related to a specified key-point. In particular, each data record typically includes information fields for an identifier of the specified key-point, an identifier of an associated component on a BUT, x and y coordinates relative to specified axes on the BUT, and an indication of whether the key-point is a local reference point or a measurement point. If the specified key-point is a measurement point, then the associated data record also includes an indication of a local reference key-point, and both minimum and maximum acceptable heights relative to the local reference key-point.

The advantages of using data records are two-fold. First, computer controller 114 can quickly identify an associated component, a location, and a type for each key-point by simply reading a particular information field. Second, controller 114 can group data records in various ways to optimize the performance of the defect analyzer.

For example, during a test sequence, the data records might be grouped according to the locations of associated key-points on a BUT. Accordingly, the defect analyzer might first partition the BUT into a plurality of sectors, and then measure the heights of key-points in adjacent sectors. This would typically minimize test time because the defect analyzer would not be making large excursions across the BUT when moving from key-point to key-point.

Alternatively, the data records of key-points associated with a common component might be grouped together. This grouping can be used to develop a component-by-component programming system, in which test programs are written for individual components on the BUT. Specifically, this grouping scheme facilitates adding or deleting key-points, and adjusting pass/fail limits for a particular component on a BUT.

The component-by-component programming system is consistent with most programming methods for in-circuit testing, which typically focus upon testing only a single component or a small group of components on the BUT at a time. Further, the component-by-component programming system can be used for either automatically or manually developing test programs. For example, parts lists, board and component geometries, assembly machine instructions, and solder paste stencils can be used for automatically specifying key-points and pass/fail limits for each component on the BUT. Also, an x-y-z motion system (not shown) and a miniature video camera (not shown) might be incorporated into the defect analyzer for manually performing fiducial recognition and alignment, and for manually specifying locations of key-points for each component.

Grouping together data records of key-points associated with a common component is also useful when the common component can be obtained from more than one fabrication source. Printed circuit board designers commonly specify components that can be obtained from multiple sources. This is because an alternate source for a component might be used if shortages of the component occur for one manufacturer. Also, if the price of a component increases significantly, then the component might be purchased from an alternate source at a cheaper price.

However, although components supplied by different sources typically have the same electrical and functional characteristics, they might be housed in packages having different physical dimensions. As a result, the information in data records of key-points for components that are available from different sources might be incorrect. An advantage of the present invention is that accommodations can be easily made for inspecting printed circuit boards having components with multiple sources.

Figure 5:
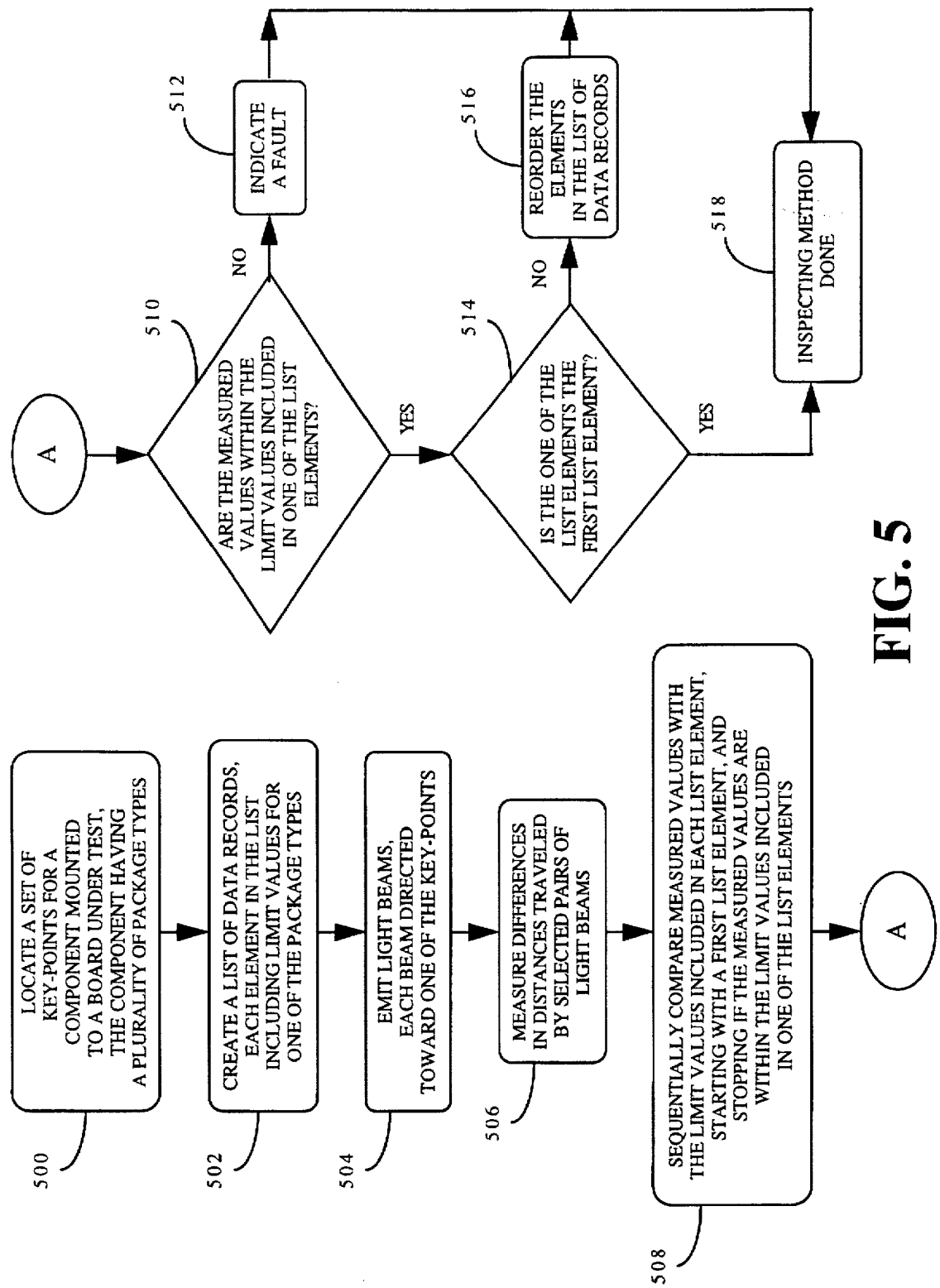
FIG. 5 is a flowchart depicting an alternative inspecting method according to the present invention.

Referring to the procedure shown in FIG. 5, a set of key-points is located in block 500 for a component attached to a BUT, wherein the component has more than one package type available. The set of key-points preferably includes at least one local reference.

Next, a list of data records is created in a memory in block 502. Each element in the list includes data records related to one of the package types for the component. As mentioned above, each data record is a means for aggregating a group of information related to one of the key-points located in block 500. Further, if a key-point is a measurement point, then an associated data record would include an indication of one of the local references, and both minimum and maximum acceptable heights relative to the local reference. As an illustrative example, the package types for the component consist of types A, B, C, D, and E. Also, data records for each package type are sequentially listed, from A to E, in the list of data records created in block 502.

Next, a plurality of light beams is emitted in block 504, whereby each light beam strikes one of the key-points located in block 500. Further, differences in distances traveled by selected pairs of light beams are measured in block 506.

Next, the differences measured in block 506 are compared with related minimum and maximum acceptable heights for each package type in block 508, wherein the comparing is preferably performed sequentially starting with an element in a first position in the list of data records. For the illustrative example, the defect analyzer makes comparisons using the data records for package type A. If the measured values are not within ranges of acceptable heights for package type A, then the defect analyzer continues making comparisons using the data records for package type B, and so on. If the measurements are not within ranges of acceptable heights for any package type in the list, then decision block 510 causes the procedure to branch to block 512, thereby causing the defect analyzer to indicate a fault.

However, if the measured values are within ranges of acceptable heights for one of the package types, then decision block 510 causes the procedure to branch to decision block 514. Further, if data records for the one of the package types are not stored in the first list element, then decision block 514 causes the procedure to branch to block block 516, which implements a comparison priority procedure. In particular, the elements in the list of data records are reordered in block 516 such that the data records, which have ranges of acceptable heights that bound the measurements made in block 506, are moved to the first position in the list, and the remaining elements in the list retain their prior relative positions.

For the illustrative example, suppose that the data records for package type C have ranges of acceptable heights that match the component under inspection. In this case, the order of data records for each package type in the list is changed in block 516 from A through E, to C, D, E, A, and B. As a result, when the defect analyzer inspects a corresponding component on a subsequent BUT, it will use the data records for package type C first. If the printed circuit board designer has in fact substituted package type C for the corresponding component, then inspecting the corresponding component using the data records for package types A and B will be avoided, and inspection time will be minimized.

However, if the data records for package type E have ranges of acceptable heights that match the corresponding component under inspection, then the order of data records in the list will be changed in block 516 from C, D, E, A, and B, to E, C, D, A, and B. Although package type E may have been substituted for package type C, some boards might still be using components with package type C. This is why data records for package type C are placed in the second list position instead of being placed in the last list position.

Having described one embodiment, numerous alternative embodiments or variations might be made. For example, it was described that the defect analyzer uses a single light source and a single optical receiver. However, this was merely an illustration. The defect analyzer may be implemented using multiple light sources and multiple receivers. Further, different types of light sources and receivers may be used for different surfaces and different angles of reflection.

Also, the defect analyzer may be varied so that the light source and optical receiver are fixed and the board under test is movable. Alternate embodiments may include a fixed board under test and a movable light source and receiver.

Also, it was described that an x-y-z motion system (not shown) and a miniature video camera (not shown) might be incorporated into the defect analyzer for manually performing fiducial recognition and alignment, and for manually specifying locations of key-points for each component. The x-y-z motion system and the miniature video camera might also perform height measurements that extend beyond the range of the triangulation technique.

Also, it was described that optical receiver 112 includes a PSD having a PIN diode with two current outputs. However, this was also merely an illustration. Optical receiver 112 may be implemented using any device capable of producing an output that is a function of the position of an incident beam of light, including a charge-coupled device or a video camera.

Finally, it was described that a list of data records for each available component package type can be created, and the data records for a current package type can be placed in a first position in the list, the data records for a previous package type can be placed in a second position in the list, and so on. However, this also was merely an illustration. Other ordering schemes may be devised to minimize test time. Further, the same order for the list of data records may be used when inspecting a component that is used in more than one location on the BUT.

Therefore, the invention should be limited only by the spirit and scope of the appended claims.

What is claimed is:

1. A method for inspecting an assembled printed circuit board, using a device for detecting height data on the assembled printed circuit board, the device including a database memory, comprising the steps of:

(a) locating a plurality of points, the plurality of points being associated with a component attached to the printed circuit board;

(b) creating in the database memory a list having a plurality of elements, each element including limit values related to one of a plurality of package types for the component, at least one of the limit values being related to one of the points located in step (a);

(c) detecting height data for at least one of the points located in step (a);

(d) comparing the detected height data with the limit values included in each element in the list, wherein the comparing is performed sequentially starting with an element in a first list position;

(e) when the detected height data compared in step (d) is outside the limit values included in each element in the list, indicating that the associated component is defectively attached to the printed circuit board;

(f) when the detected height data compared in step (d) is within the limit values included in one of the elements in the list, ceasing the comparison and following a comparison priority procedure comprising the step of (i) reordering the elements in the list, wherein the one of the elements is moved from a current list position to the first list position, and wherein remaining elements retain respective relative positions; and (g) repeating steps (c) through (f) for corresponding components on subsequent printed circuit boards.

2. In a process for assembling a printed circuit board, a method for inspecting the assembled board, using a device for detecting height data on the assembled board, wherein the assembled board has a plurality of components attached thereto, comprising the steps of:

(a) locating a plurality of groups of points, each group of points being associated with one of the components, each group of points including at least one point located on a top surface of the associated component and at least one point located on a surface of the assembled board and adjacent to the associated component, wherein the plurality of groups of points is located before the device for detecting height data is used to inspect the board;

(b) storing information related to each located point, the information including an identifier for the located point, an identifier for the associated component, and coordinates indicating a position of the located point relative to the surface of the assembled board;

(c) dividing the surface of the assembled board into a plurality of regions, each region including at least one located point;

(d) detecting height data for the at least one located point in each region, starting with a first region and continuing sequentially with adjacent regions until height data is detected for each located point;

(e) comparing the detected height data with expected height data; and (f) when the detected height data does not match the expected height data, identifying at least one defectively attached component using the stored information.

3. The method for inspecting as recited in claim 2, wherein at least one group of points further includes at least one point located on one of a plurality of leads connected to the associated component.

4. The method for inspecting as recited in claim 3, wherein the at least one group of points further includes at least one point located on a solder joint connecting the lead to the assembled board.

5. The method for inspecting as recited in claim 4, wherein the at least one group of points further includes at least one point on the surface of the assembled board, adjacent to the associated component, and between a pair of the leads.

6. The method for inspecting as recited in claim 2, wherein at least one group of points further includes a point on an orientation mark on the associated component.

7. The method for inspecting as recited in claim 2, wherein the stored information further includes a type for each located point, the type being selected from the group consisting of a measurement point and a local reference point.

8. The method for inspecting as recited in claim 7, wherein, when the type is selected as being a measurement point, the stored information further includes an identifier for an associated local reference point, a minimum height value relative to the associated local reference point, and a maximum height value relative to the associated local reference point.

9. The method for inspecting as recited in claim 2, wherein the detecting comprises the substeps of (i) generating a plurality of beams of light, each beam striking one of the located points, and (ii) measuring differences in distances traveled by selected pairs of the beams of light.

10. An apparatus for inspecting an assembled printed circuit board, wherein the assembled board has a plurality of components attached thereto, comprising:

(a) means for storing information related to predetermined groups of points, each group of points being associated with one of the components, the stored information including a first identifier for each point, a second identifier for each component associated with each group of points, and coordinates indicating a position of each point relative to a surface of the assembled board;

(b) means for detecting height data for the points in each group;

(c) means for comparing the detected height data with expected height data; and (d) means for identifying defectively attached components using the stored information when the detected height data does not match the expected height data, wherein the groups of points is determined before the means for detecting height data is used to inspect the board.

11. The apparatus for inspecting an assembled printed circuit board as recited in claim 10, wherein the means for detecting includes a laser diode.

12. The apparatus for inspecting an assembled printed circuit board as recited in claim 10, wherein each group of points includes at least one point on the associated component and at least one point on the assembled board near the associated component.

13. The apparatus for inspecting an assembled printed circuit board as recited in claim 12, wherein each group of points further includes at least one point on one of a plurality of leads connected to the associated component, and at least one point on a solder joint connecting the one lead to the assembled board.

14. The apparatus for inspecting an assembled printed circuit board as recited in claim 12, wherein at least one group of points includes a first point on the assembled board and adjacent to the associated component, a second point on one of a plurality of leads connected to the associated component, a third point on a solder joint connecting one of the leads to the assembled board, a fourth point on the assembled board and adjacent to the associated component and between a pair of the leads, a fifth point on the associated component and near an edge of the associated component, and a sixth point on an orientation mark on the associated component.

15. The apparatus for inspecting an assembled printed circuit board as recited in claim 10, wherein the means for detecting includes a position-sensitive detector.

* * * * *